Oct. 31, 1967 M. H. PILKUHN ET AL 3,349,476

FORMATION OF LARGE AREA CONTACTS TO SEMICONDUCTOR DEVICES

Filed Nov. 26, 1963

INVENTORS
MANFRED H. PILKUHN
HANS S. RUPPRECHT

BY John F. [signature]
ATTORNEY

United States Patent Office 3,349,476

Patented Oct. 31, 1967

3,349,476

FORMATION OF LARGE AREA CONTACTS TO SEMICONDUCTOR DEVICES

Manfred H. Pilkuhn, Mahopac, and Hans S. Rupprecht, Yorktown Heights, N.Y., assignors to International Business Machines Corporation, New York, N.Y., a corporation of New York Filed Nov. 26, 1963, Ser. No. 326,091
4 Claims. (Cl. 29—590)

This invention relates to semiconductors devices and, more particularly, to a technique and procedure for making ohmic contacts to semiconductor crystalline bodies that serves as signal translating devices.

In the development of semiconductor devices it has frequently been found desirable to keep the local current density small for a given total current and also to reduce the ohmic component of the series resistance to a minimum in order to prevent excessive Joule heating.

In connection with the fabrication of the so-called injection laser devices, which comprise semiconductor bodies in which pn junctions are former so as to provide light radiation due to the stimulation of emission resulting from carrier injection and recombination, the requirements of large area ohmic contacts become of particular importance. They have been found essential in order to optimize the performance of the devices which can be characterized by the following parameters: (1) Efficiency (power and quantum efficiency); (2) Total light output and (3) operating temperatures. The influence of large area contacts upon the performance of injection laser devices is two fold: (1) lowering the Joule heating, which increases the efficiency and enables the units to be operated at higher currents, therefore increasing the total light output; (2) lowering the threshold current by producing a uniform current distribution across the junction plane and thereby avoiding reabsorption of the emitted light in sub-lasing regions of the junction. This last effect also acts in favor of increased efficiency, total light output and operating temperature.

In order to provide the requisite large area ohmic contacts it has been the practice to deposite a material such as nickel by plating onto a surface or surfaces of the semiconductor body in which the laser junction has been formed. Such a procedure has been referred to in an article, "Observation of the Dielectric Wave Guide Mode of Light Propagation in pn Junctions" by Bond et al., Applied Physics Letters, vol. 2, No. 3, Feb. 1, 1963.

In order to preclude the possibility that the nickel or other plating which is formed on a surface of the semiconductor body will oxidize seriously and, further, in order to provide ready wetting when an electrical lead is to be attached to the ohmic contact, it has been found desirable to add a coating of gold over the aforesaid nickel plating.

What has been found, unexpectedly, is that if a very thin layer or "flash" coating of gold is initially deposited upon the semiconductor body before the nickel will adhere more strongly and will deposit more easily onto the semiconductor body. However, there is no adverse effect by such a procedure, such as might be expected in regard to affecting the conductivity type within the semiconductor body. In other words, the contact remains a low resistance ohmic one and does not become rectifying.

Accordingly, it is an object of the present invention to provide a strongly adherent ohmic contact to a semiconductor body to permit the ready attachment of current leads.

Another object is to produce a well bonded large area metal contact to an injection laser structure.

The foregoing and other objects, features and advantages of the invention will be apparent from the following more particular description of preferred embodiment of the invention, as illustrated in the accompanying drawings.

Although reference will be made hereafter in the specification to the particular fabrication of an injection laser device and more particularly to a device comprising a GaAs crystalline body, it will be understood that the present invention is not limited to this one type of device, nor to this one semiconductor material, but that the principles thereof in regard to contact formation are also applicable to other semiconductor devices requiring large area ohmic contacts.

Figures 1, 2:
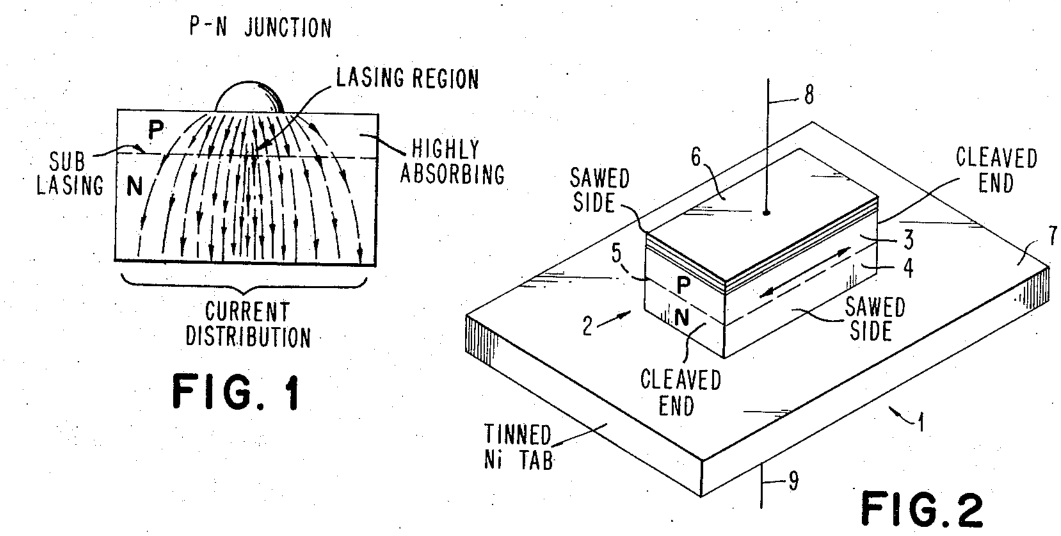
FIGURE 1 is a cross-sectional view of a typical laser structure depicting the effects of a small area contact to the semiconductor body.
FIGURE 2 is a perspective view of the entire structure of an injection laser device shown mounted to a tab.

Referring now to FIGURE 1 there is depicted the adverse current distribution in an injection laser structure when a small area contact is made to the semiconductor body. Most of the lasing action, that is, the actual stimulated emission, occurs very near to the plane of the pn junction and it is only in the restricted area immediately beneath the dot contact shown on the surface that the current density is sufficiently great to produce the lasing. However, with such an inhomogeneous or nonuniform current distribution, a larger part of the power input is wasted in Joule heating that it would be for a homogeneous current distribution, and further, the stimulated emission that is produced in the area immediately under the contact tends to be reabsorbed in those portions that are not at all or less contributing to the lasing.

By providing an ohmic contact over substantially the entire surface of the structure of FIGURE 1 the above cited effects will not be produced but rather there will be uniform current distribution across the junction plane, resulting in a lowering of the threshold current, as has been experimentally demonstrated.

Referring now to FIGURE 2, there is illustrated an injection laser structure having the proper uniform current distribution due to a large area ohmic contact formation. The entire structure is denoted by numeral 1 which comprises a semiconductor body 2 in which p and n regions 3 and 4 define the junction 5. Broad area contact 6 is present on the top surface of the semiconductor body 2 and body 2 is mounted to a thin nickel tab 7. Electrical conductors 8 and 9 are shown affixed respectively to ohmic contact 6 and the aforesaid nickel tab 7.

The pn junction 5 is so formed that it is capable of producing stimulated emission of radiation. This stimulated emission is achieved simply by forward biasing the pn junction 5 so as to inject carriers of opposite types into the respective regions 3 and 4, that is, electrons are injected from the region 4, in which they are majority carriers, into the region 3 and holes are injected from region 3 into region 4. The observed radiation stems from the recombination of the injected carriers.

For most efficient operation the structure of FIGURE 2 has been so fashioned that the ends are cleaved and the sides sawed to provide the most efficient and directional stimulated emission. The coherent light which results from the proper biasing of the device, by application of bias to leads 8 and 9, is shown by the arrows drawn just above the junction plane, indicating that the light is radiated from one cleaved end to another. This technique of cleaving the ends of the crystalline wafer and sawing the sides forms no part of the invention but is thought to be helpful to clarify the application of the principles of the present invention.

Referring now to FIGURES 3A–3D there are illustrated the several steps that are followed in the specific application of the present invention to ohmic contact formation to the p type region of an injection laser device. A semiconductor wafer 10, shown in FIGURE 3A, which has been sliced from a crystalline ingot, such as of GaAs, is selected to be n type conductivity by incorporating a typical impurity such as Te, and a pn junction is created by diffusing into the wafer 10 an opposite conductivity type impurity, that is, a p type impurity such as zinc. Thus there is an inhomogeneous or graded impurity concentration profile on the p side of the semiconductor wafer.

Figure 3A:
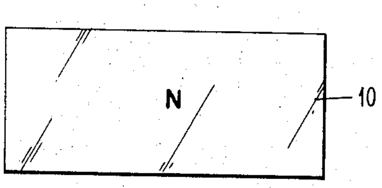
FIGURES 3A–3D illustrate steps in the fabrication of the device of FIGURE 2, particularly illustrating the formation of contacts thereto.
Figure 3B:
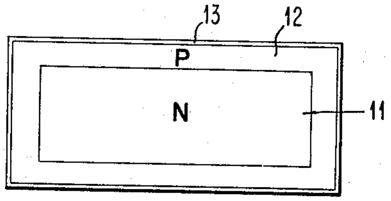

After formation of the pn junction comprising regions 11 and 12 in the wafer 10 as illustrated in FIGURE 3B, a gold flash coating 13 is applied to the entire surface of the semiconductor wafer 10. Before the application of the gold flash the surface of the wafer 10 is first polished with a typical abrasive powder such as Linde A. The gold flash 13 is realized by an electrolytic gold deposition technique which gives a very thin gold film, typically on the order of 5000 A. The electrolyte that may be used for the gold deposition consists of a solution of a Sel Rex Antromex CI formula.

Figure 3C:
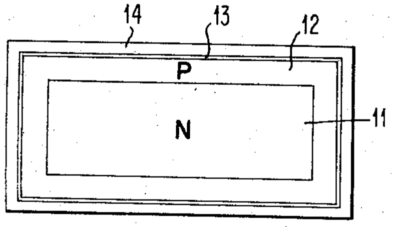

As illustrated in FIGURE 3C, subsequent to the application of the gold flash or film 13 a nickel film is deposited either by an electrolytic technique, or in an electroless manner such as by using a solution of 42.5 g. of nickel chloride, 9 g. of sodium citrate, and 9 g. of sodium hypophosphite in 950 ml. of water at a temperature of approximately 190° F.

It has been found that with the initial deposition of the above described gold-flash 13 on the entire surface of the semiconductor body 1 there is a significant improvement in the step of nickel deposition. Without the formation of this initial gold-flash it was found that the nickel would not adhere as strongly to the semiconductor body and there is a tendency for it to peel off the body.

Figure 3D:
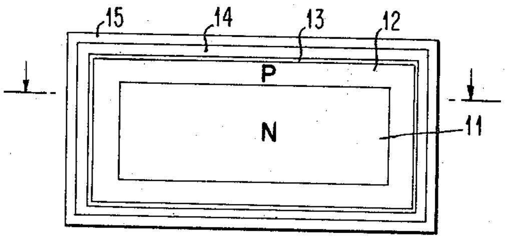

As shown in FIGURE 3D a further coating of gold is deposited over the surface of the semiconductor wafer 10. This coating or film 15 is considerably thicker than the original gold flash coating 13, being approximately ten times thicker. This further coating of gold, as explained before, is most useful in preventing oxidation and it is readily wetted by the latter application of a typical alloy, such as of indium, for attaching the current lead to the ohmic contact.

The wafer as shown in its final form in FIGURE 3D has a cross-section of approximately 1 cm.$^2$. It is now processed to produce tiny injection laser devices. First, the structure of FIGURE 3D is cut as indicated by the arrow and stripes or long bars are sawed out of the wafer in the {110} crystallographic direction, typically by using a string saw. These long bars so obtained have dimensions, for example, of about 5 mils in width and about 3 mils in thickness. They are then cleaved along the {110} direction, which is the preferred cleavage plane, so as to give a laser unit as depicted in FIGURE 2 having an exemplary length of approximately 10 mils. The ohmic contact 6 which is shown affixed to the top of the laser units in FIGURE 2, of course, comprises the three layers 13, 14 and 15 which were applied as described above.

A large number of laser units were fabricated following the technique of the present invention as previously described and the majority of these units were constituted of crystalline bodies of various compositions of GaAs and GaP. The varying nature of this composition may be represented by the formula $GaAs_xP_{1-x}$ where $$0 \leqq X \leqq 1$$

Of course, it will be appreciated that the technique of the present invention is not limited to contact formation merely to devices of the aforesaid composition, but that it may be applied to other injection laser devices, and also to other types of semi-conductor devices where the requirement is for a strongly adherent ohmic contact to a crystalline body.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming a large area ohmic contact to a device constituted of a semiconductor body comprising $GaAs_xP_{1-x}$, where $0 \leqq X \leqq 1$, in which a junction is formed capable of emitting light radiation comprising the steps of:

(a) electrolytically depositing a very thin coating of gold on one surface of p conductivity type of said semiconductor body;

(b) electrodelessly depositing over said flash coating of gold a nickel film, from a solution equivalent to about 42.5 g. of nickel chloride, 9 g. of sodium citrate, and 9 g. of sodium hypophosphite in 950 ml. of water at a temperature of approximately 190° F.;

(c) thereafter depositing a relatively thick gold film over said nickel film; and (d) affixing at least one electrical conductor to the one surface of said semiconductor body having said gold flash coating, said nickel film and said relatively thick gold film thereon.

2. A method of forming a large area ohmic contact to a device constituted of a semiconductor body in which a junction is formed capable of emitting light radiation comprising the steps of:

(a) electrolytically depositing a very thin coating of gold, on the order of 5000 A. in thickness, on one surfaces of p conductivity type of said semiconductor body, (b) electrodelessly depositing over said flash coating of gold a nickel film, from a solution equivalent to about 42.5 g. of nickel chloride, 9 g. of sodium citrate, and 9 g. of sodium hypophosphite in 950 ml. of water at a temperature of approximately 190° F., (c) thereafter depositing a relatively thick gold film over said nickel film, and (d) affixing at least one electrical conductor to the one surface of said semiconductor body having said gold flash coating, said nickel film and said relatively thick gold film thereon.

3. A method of forming a large area ohmic contact to a device constituted of a semiconductor body wherein a junction is formed capable of emitting light radiation comprising the steps of:

electrolytically depositing a very thin coating, on the order of 5000 A. in thickness, of gold on one surface of p conductivity type of said semiconductor body;

electrodelessly depositing a nickel film over said flash coating of gold, thereafter depositing a gold film having a thickness approximately ten times said gold flash coating over said nickel film, and affixing at least one electrical conductor to the one surface of said semiconductor body having said gold flash coating, said nickel film and said relatively thick gold film thereon.

4. A method of forming large area contacts to a device constituted of a semiconductor body comprising the steps of:

providing a wafer having a junction capable of emitting light radiation and having an outer surface which is p conductivity type;

electrolytically depositing a flash coating of gold, in the order of 5000 A. in thickness, over the entire surface of said semiconductor wafer, electrodelessly depositing a nickel film completely over said flash coating of gold, thereafter depositing a gold film having a thickness approximaely ten times said gold flash coating completely over said nickel film, cutting up said wafer so as to form small laser units, and affixing at least one electrical conductor to the surface of the units having said gold flash coating, said nickel film and said relatively thick gold film thereon.

References Cited

UNITED STATES PATENTS

| | | | |
|---|---|---|---|
| 2,916,806 | 12/1959 | Pudvin | 29—492 X |
| 2,995,473 | 8/1961 | Levi. | |
| 3,028,663 | 4/1962 | Iwersen | 117—217 X |
| 3,046,176 | 7/1962 | Bosenberg. | |
| 3,169,304 | 2/1965 | Gould | 29—155.5 |
| 3,187,403 | 6/1965 | Ohntrup | 29—25.3 |
| 3,245,002 | 4/1966 | Hall | 331—94.5 |
| 3,253,320 | 5/1966 | Levi-Lamond | 29—155.5 |

WILLIAM I. BROOKS, *Primary Examiner.*